United States Patent [19]
Fawal et al.

[11] Patent Number: 5,801,602
[45] Date of Patent: Sep. 1, 1998

[54] ISOLATION AND SIGNAL FILTER TRANSFORMER

[75] Inventors: Marwan Ahmad Fawal, Santa Clara; Anthony Liem Pan, Fremont; Eric Roger Davis, San Jose; Richard Sidney Reid, Mountain View, all of Calif.

[73] Assignee: 3Com Corporation, Santa Clara, Calif.

[21] Appl. No.: 641,375

[22] Filed: Apr. 30, 1996

[51] Int. Cl.$^6$ ............................................... H03H 7/09
[52] U.S. Cl. .................. 333/177; 333/184; 333/185; 336/200; 336/232
[58] Field of Search ........................... 333/177, 181, 333/184, 185; 336/200, 232

[56] References Cited

U.S. PATENT DOCUMENTS

| | | | |
|---|---|---|---|
| 4,063,201 | 12/1977 | Komatsubara et al. | 333/177 X |
| 4,103,267 | 7/1978 | Olschewski | 336/65 |
| 4,193,048 | 3/1980 | Nyhus | 336/26 |
| 4,342,976 | 8/1982 | Ryser | 336/200 X |
| 4,376,274 | 3/1983 | Smart | 336/200 X |
| 4,494,109 | 1/1985 | Bernin | 341/32 |
| 4,689,593 | 8/1987 | Richardson | 336/90 |
| 4,847,986 | 7/1989 | Meinel | 29/606 |
| 4,975,671 | 12/1990 | Dirks | 336/65 |
| 4,977,491 | 12/1990 | Domenget et al. | 363/15 |
| 5,003,622 | 3/1991 | Ma et al. | 336/26 X |
| 5,126,714 | 6/1992 | Johnson | 336/83 |
| 5,173,671 | 12/1992 | Wendler et al. | 333/185 |
| 5,353,001 | 10/1994 | Meinel et al. | 336/200 X |
| 5,410,535 | 4/1995 | Yang et al. | 370/248 |
| 5,430,895 | 7/1995 | Huusko | 455/327 |
| 5,469,334 | 11/1995 | Balakrishnan | 361/782 |
| 5,477,204 | 12/1995 | Li | 336/200 |
| 5,497,137 | 3/1996 | Fujiki | 336/200 |

FOREIGN PATENT DOCUMENTS 63-176009  7/1988  Japan.

*Primary Examiner*—Robert Pascal
*Assistant Examiner*—Justin P. Betterdorf
*Attorney, Agent, or Firm*—Wilson Sonsini Goodrich & Rosati

[57] ABSTRACT

One embodiment of the invention includes a transformer that is at least partially formed on a substrate. The transformer is for electrical isolation and signal filtering. The transformer includes the following elements. A portion of the substrate has two holes through the substrate. A ferrite core is formed in a loop through the two holes. A primary winding is made of a first metal trace. The first metal trace is formed in a spiral around one hole. The first metal trace has at least two primary terminals acting as an input to the transformer. The transformer also includes a secondary winding. The secondary winding is made of a second metal trace. The second metal trace is formed in a spiral around the other hole. The second metal trace has at least two secondary terminals acting as an output from the transformer. The parasitic capacitance of the first metal trace and the magnetizing inductance of the primary winding cause signals received at the primary terminals to be filtered as the signals are passed through the transformer to the secondary terminals.

17 Claims, 14 Drawing Sheets

5,801,602

1

ISOLATION AND SIGNAL FILTER TRANSFORMER

THE FIELD OF THE INVENTION

This invention relates to the field of communications circuits. In particular, the invention relates to a use of an isolation and filter circuit.

BACKGROUND OF THE INVENTION

Isolation circuits and filter circuits are often used in devices connected to transmission lines. The transmission lines carry a signal to the devices or away from the devices. In a network adapter card, for example, a combination isolation and filter circuit is used to transfer and filter a signal from the network cable to the adapter card, or from the adapter card to the network cable. The isolation part of the circuit isolates the rest of the adapter card circuitry from the network cable. The filter part removes high frequency components of the signal.

FIG. 1 illustrates two combination isolation and filter circuits 100 as used in a 10 MHz ethernet adapter card. The transmit circuit 101 transmits signals from the adapter card to the network cable, while the receive circuit 102 receives signals from the network cable and transmits them to the adapter card. Part number FL 1012 and FL 1066, available from Valor, Inc., implements the isolation and filter circuits 100.

The transmit circuit 101 includes a filter 110, a transformer 120 and a common mode choke circuit 130. The filter 110 connects to the transmit side of the adapter card electronics and to the transformer 120. The transformer 120 connects to the common mode choke circuit 130. The common mode choke 130 connects to the network cable.

The filter 110 includes a number of inductors and capacitor. The inductors and capacitors act as a seven pole filter for signals being transmitted to the network. The frequency response of the transmit circuit 101 is shown in FIG. 2. The 100 MHz frequency response graph 210 shows that the transmit circuit 101 acts as a low pass filter, with a response that quickly rolls off near 16 MHz. The 1 GHz frequency response graph 200 shows that the transmit circuit 101 does not transmit more than −20 dB for any other frequency between 25 MHz and 1 GHz. For 10 Mbit ethernet communications, such a frequency response is desirable because high frequency noise components of the transmitted signal are removed before the signal is transmitted to the network cable. The frequency response thus allows the adapter card to meet electromagnetic interference requirements.

Returning to FIG. 1, the transformer 120 electrically isolates the adapter card from the network cable. The transformer 120 has a relatively good frequency response. That is, both high frequencies (e.g., 800 MHz) and low frequencies (20 kHz) are passed through the transformer 120 with little attenuation.

The common mode choke 130 is part of the filter 110 and helps to remove high frequency components from the signal being sent to the network cable.

The receive circuit 102 includes circuits similar to those in the transmit circuit 101. However, the receive filter 112 has fewer inductors and capacitors than the filter 110, resulting in a low pass filter with fewer poles. Having fewer poles means that the receive filter 112 does not have as steep a roll off as the filter 110. Because the receive characteristics are not as stringent as the transmit characteristics, a filter having fewer poles is acceptable. Importantly, reducing the number of inductors and capacitors also reduces the cost of the filter 110.

In high volume manufacturing, saving only a few pennies per adapter card can save millions of dollars per year. The use of the isolation and filter circuit 100 adds a significant cost to the price of the adapter cards. Thus, it is desirable to have an isolation and filter circuit 100 with a lower cost but still maintain a similar frequency response.

Additionally, for different communications standards, a different part is needed to implement the different isolation and filter circuits 100. For example, one part will have the desired frequency response for 10 Mbit ethernet, while another part will have the desired frequency response for 16 MHz token ring. Maintaining an inventory of all these different parts is expensive because the individual cost of each of the parts is relatively expensive. Therefore, it is desirable to have a more versatile isolation and filter circuit 100.

A SUMMARY OF THE INVENTION

An isolation and filter transformer is described.

One embodiment of the invention includes a transformer that is at least partially formed on a substrate. The transformer is for electrical isolation and signal filtering. The transformer includes the following elements. A portion of the substrate has two holes through the substrate. A ferrite core is formed in a loop through the two holes. A primary winding is made of a first metal trace. The first metal trace is formed in a spiral around one hole. The first metal trace has at least two primary terminals acting as an input to the transformer. The transformer also includes a secondary winding. The secondary winding is made of a second metal trace. The second metal trace is formed in a spiral around the other hole. The second metal trace has at least two secondary terminals acting as an output from the transformer. The parasitic capacitance of the first metal trace, the leakage inductance and the magnetizing inductance of the primary winding and the secondary winding cause signals received at the primary terminals to be filtered as the signals are passed through the transformer to the secondary terminals. Thus, one embodiment of the invention greatly reduces the cost of manufacturing filtering and isolation circuits in network adapter cards, and other communications systems, by integrating the filtering and isolation functions into one structure.

In one embodiment, reactive elements, such as an external capacitor, are added to further change the frequency response of the transformer.

In one embodiment, the isolation and signal filter transformer is tuned to have a desired frequency response by taking advantage of the parasitic capacitances and inductances of the traces of both the primary and the secondary winding. The parasitic capacitances and inductances are controlled by the layout of these traces.

Although many details have been included in the description and the figures, the invention is defined by the scope of the claims. Only limitations found in those claims apply to the invention.

A BRIEF DESCRIPTION OF THE DRAWINGS

The figures illustrate the invention by way of example, and not limitation. Like references indicate similar elements.

THE DESCRIPTION

Isolation and Filter Circuit

Figure 1:
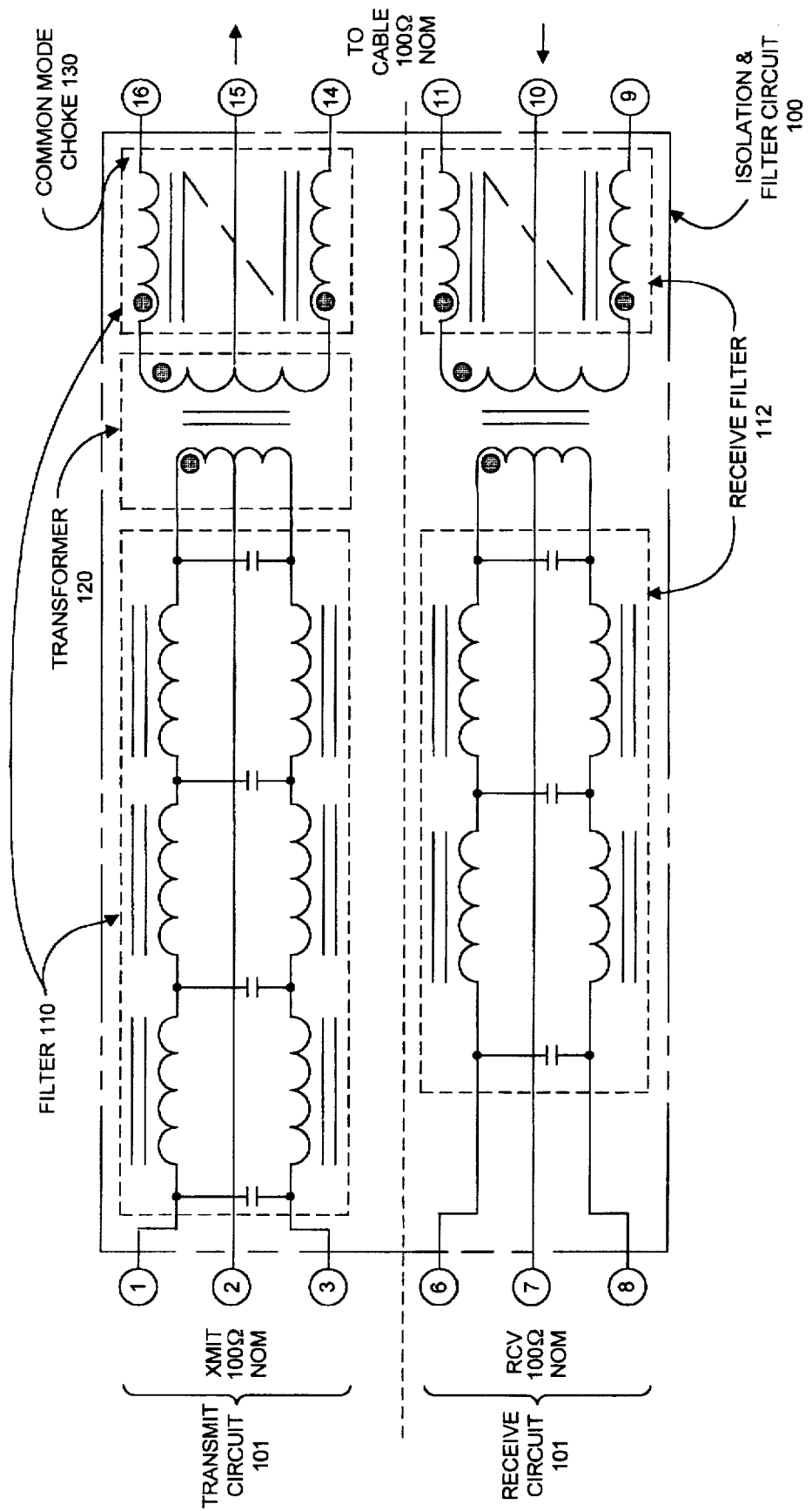
FIG. 1 illustrates a prior art filter circuit.
Figure 2A:
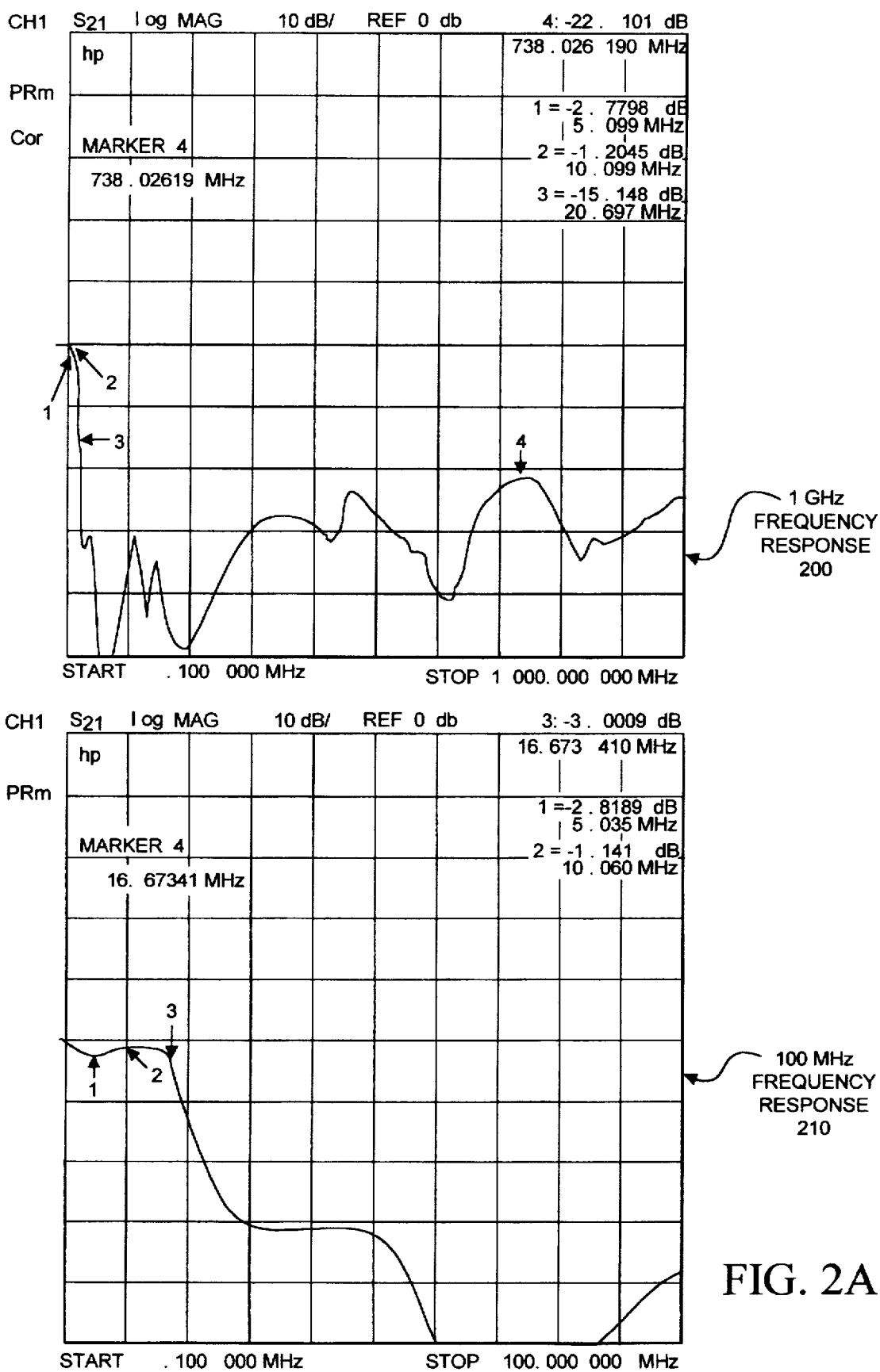
FIG. 2a and FIG. 2b illustrate the frequency response of the prior art filter of FIG. 1.
Figure 2B:
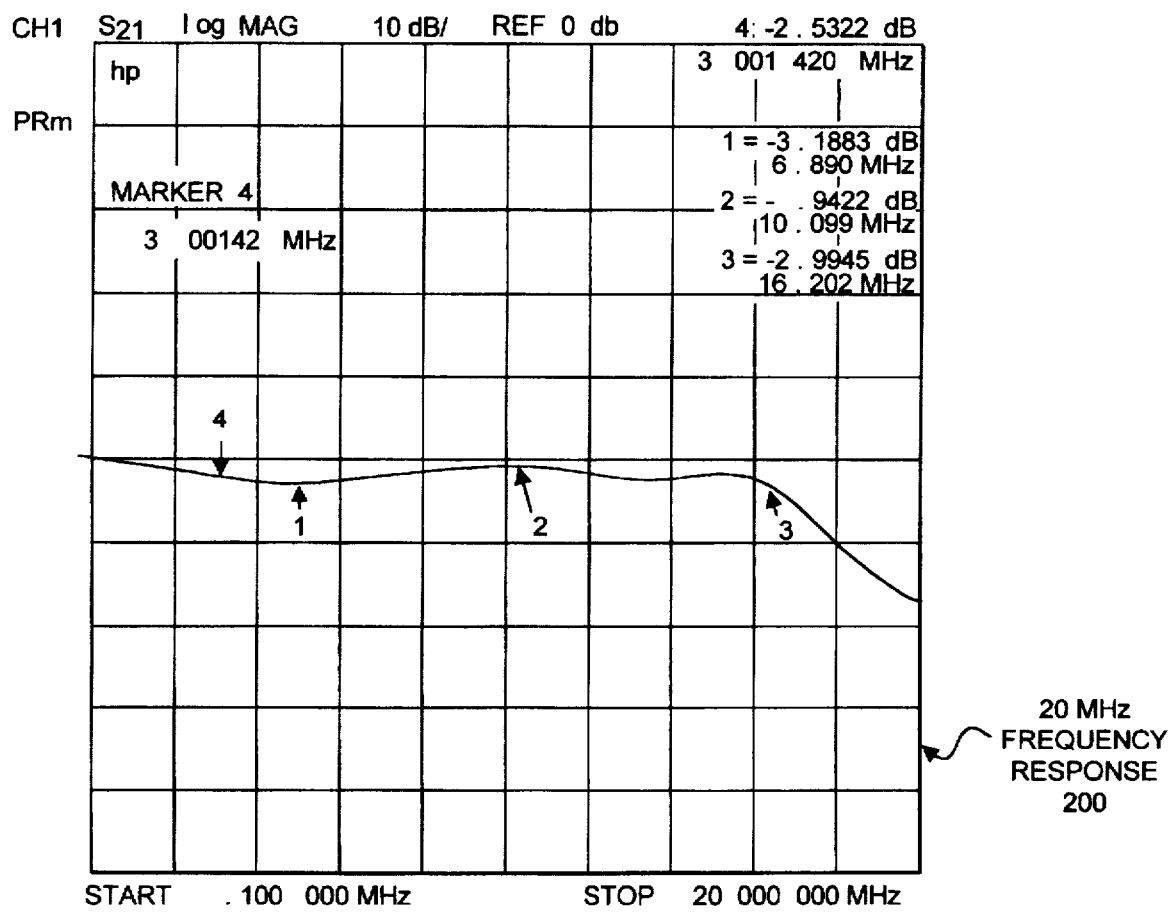
Figure 3:
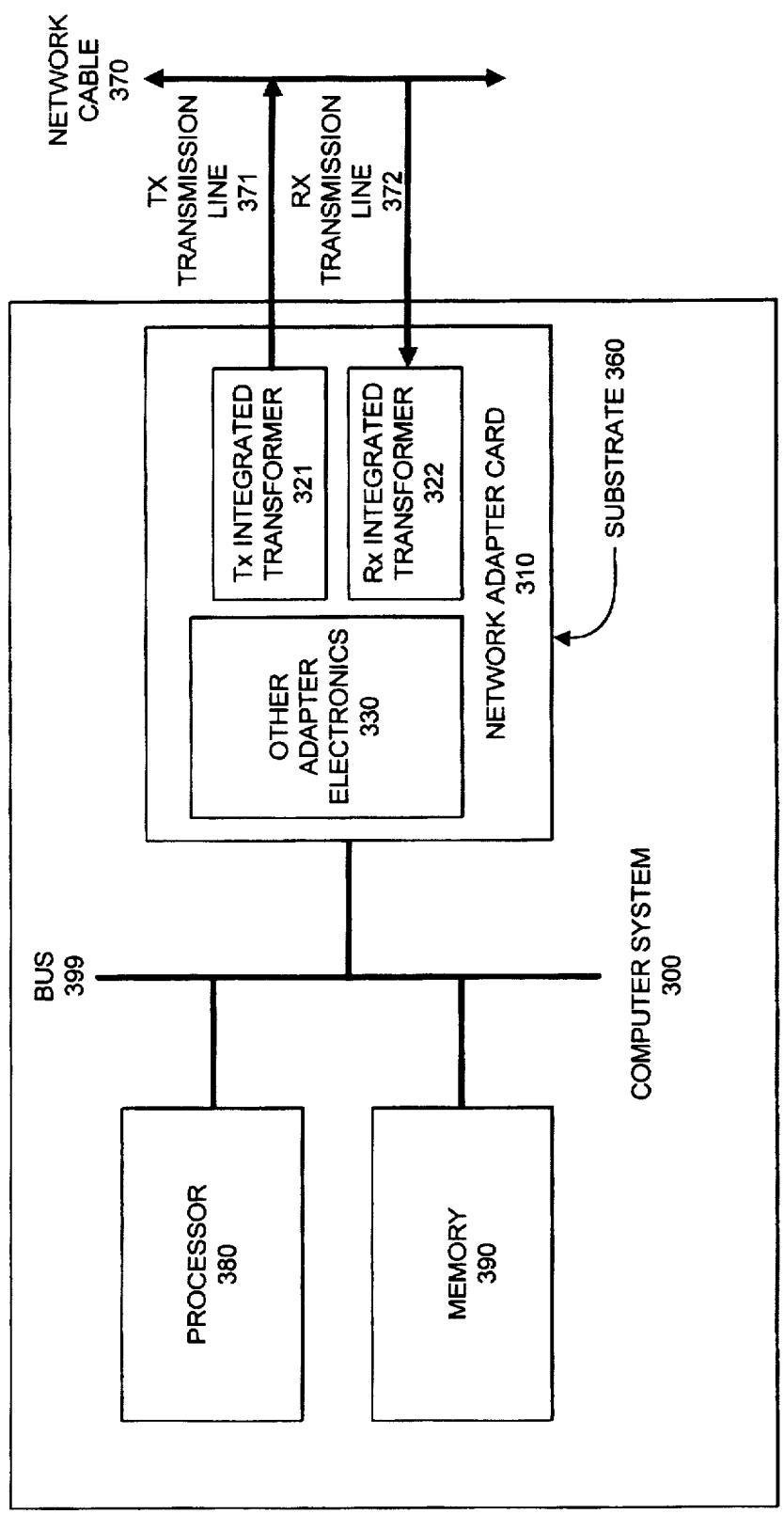
FIG. 3 illustrates one embodiment of the invention as used in a network adapter card.

FIG. 3 illustrates a network adapter card using one embodiment of the invention. FIG. 3 includes a computer system 300, with a network adapter card 310, and a network cable 370. The network adapter card 310 includes two integrated transformers that cost much less than previous combined filter and isolation circuits. In one embodiment, the two integrated transformers have their windings formed directly on, and/or in, the network adapter card's substrate. A ferrite, or other metal, core is then positioned through the windings, and therefore through the substrate. The parasitic characteristics, such as capacitance, inductance, and resistance, of these windings and the core are used to create a filter.

Before discussing the details of the integrated transformers, a use of these transformers in the computer system 300 is described. The computer system 300 includes a processor 380, a memory 390, a bus 399, and the network adapter card 310. The processor 380, the memory 390 and the network adapter card 310 are all connected to, and communicate over, the bus 399. In one embodiment, the computer system 300 includes one of an IBM PC-compatible computer, a Macintosh™ computer, a Sun Sparcstation™ computer, or some other computer having a processor and a memory.

The network cable 370 includes at least one pair, and in the example of FIG. 3, two pairs, of transmission lines. The TX (transmit) transmission lines 371 communicate signals from the network adapter card 310 to the rest of the network. The RX (receive) transmission lines 372 communicate signals from the rest of the network to the network adapter card 310. In one embodiment of the invention, the network cable 370 includes a 10base-T cable. In another embodiment, the network cable 370 includes one of: an AUI cable, twisted pair FDDI cable, 100base-T cable, and AppleTalk™ cable, or some other type of transmission line medium (e.g., a telephone line).

The network adapter card 310 includes a substrate 360, the TX integrated transformer 321, the RX (receive) integrated transformer 322, and the other adapter electronics 330. The TX integrated transformer 321, the RX integrated transformer 322 and the other adapter electronics 330 are mounted on, in and/or through the substrate 360. Both of the TX integrated transformer 321 and the RX integrated transformer 322 connect to the other adapter electronics 330. The TX integrated transformer 321 also connects to the TX transmission lines 371. The RX integrated transformer 322 connects to the RX transmission lines 372.

In one embodiment, the substrate 360 includes a double-sided printed circuit board made of 0.062 ±0.005 inch thick glass epoxy, natural color, laminated NEMA GRADE FR-4 available from Solectron, Inc. of Milpitas, Calif. The substrate 360 has a dielectric constant of 4.5 ±0.4 at 1 MHz, the dielectric strength perpendicular to an adjacent layer has a minimum of 750 VDC per 0.001 inch thickness of the substrate. Traces are formed on, or in the substrate, with ½ ounce copper. In other embodiments, other materials are used, such as, a printed circuit board having more than two layers of copper, a substrate including a ground plane layer, a 0.075 ±0.003 thick glass epoxy, or polyamide fiberglass GRADE FR-5. Other embodiments also have variations in the dielectric constant and the dielectric strength.

The other adapter electronics 330 include the electronics for preparing, sending and/or receiving data over the network cable 370 or the bus 399, and interfacing with the bus 399. In one embodiment, the other adapter electronics 330 includes the circuits for implementing the 10base-T standard, except for those parts of the standard implemented by the integrated transformers. In other embodiment, the other adapter electronics 330 implement other communications standards.

In one embodiment, the computer system 300 does not include the network adapter card 310. In this embodiment, the components on the network adapter card 310 are included directly on the motherboard to which the processor 380 and the memory 390 are mounted.

Integrated Transformer

As mentioned previously, in one embodiment, the integrated transformers are manufactured by forming the windings directly on the substrate and inserting a core through the windings. This process results in a less than ideal transformer. Significant parasitic capacitance, inductance, and resistance are all a result of manufacturing the integrated transformers in this way. However, one embodiment of the invention uses these parasitic characteristics advantageously to create a filter. The filter passes only those parts of a signal that are desired. Thus, the integrated transformers completely, or at least partially, replace the prior art combined isolation and filter circuit 100. This significantly reduces the cost of the network adapter card 310.

Figure 4:
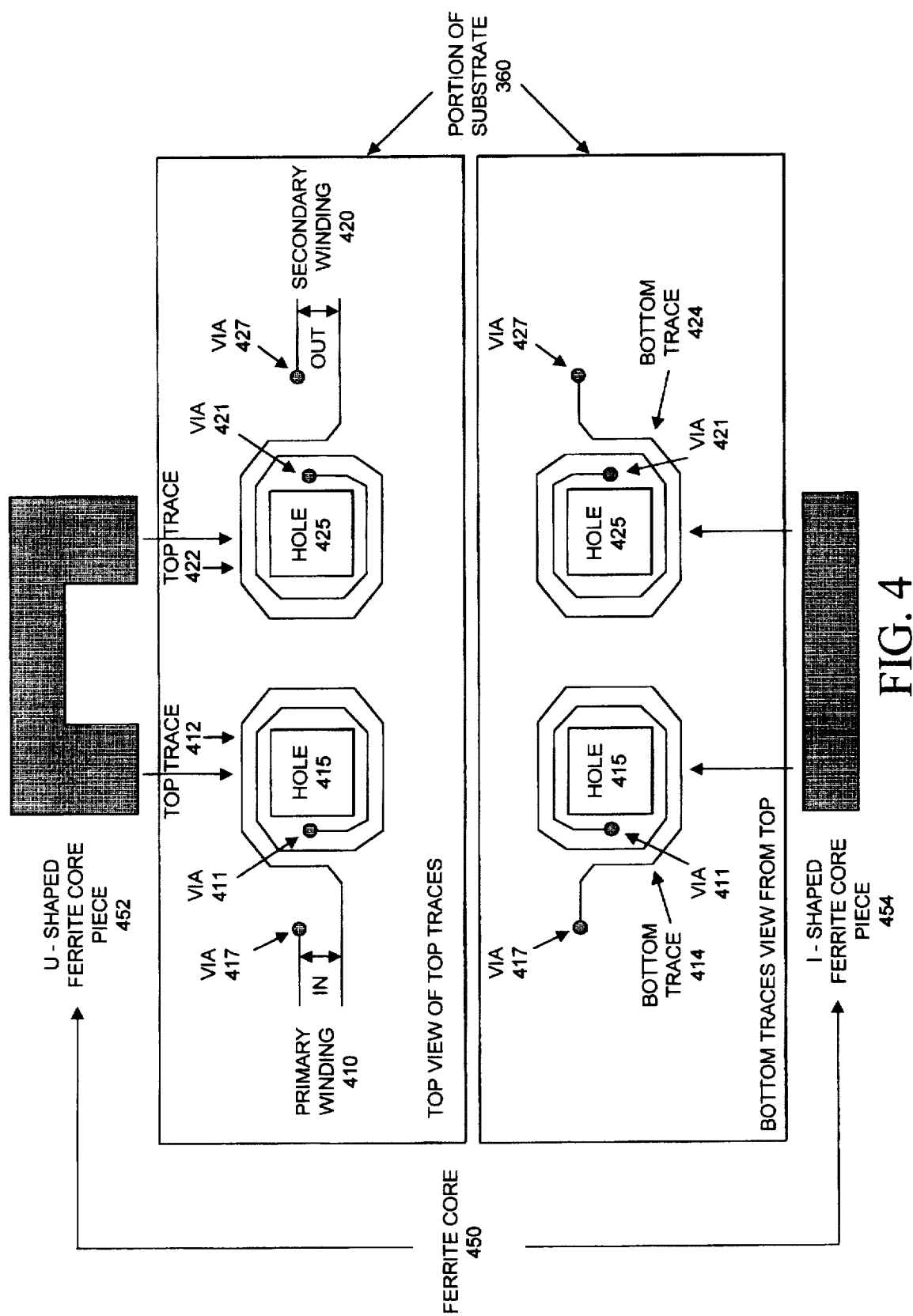
FIG. 4 illustrates a layout of a transformer.

FIG. 4 shows a layout of an integrated transformer 400. In other embodiments of the invention, variations of the integrated transformer 400 are used as the TX integrated transformer 321 and the RX integrated transformer 322.

The integrated transformer 400 includes two sets of windings, two holes and a ferrite core 450. The two sets of windings include the primary winding 410 and the secondary winding 420. Note that in another embodiment, the primary winding 410 is used as a secondary winding, while the secondary winding 420 is used as a primary winding. The primary winding 410 is made of a top trace 412 and a bottom trace 414 that are connected through the substrate 360 by the via 411. Similarly, the secondary winding 420 is made of a top trace 422 and a bottom trace 424 that are connected through the substrate 360 by the via 421.

FIG. 4 presents two top views of a portion of the substrate 360 to show the two traces. The first top view shows the top traces formed as spirals, around the holes, on the top surface of the substrate 360. The bottom traces are formed as spirals, around the holes, on the bottom surface of the substrate 360. In this embodiment, the bottom traces are formed directly under the top traces. Thus, for the purpose of illustration, the bottom traces are shown with dashed lines in a second top view. (The second top view shows the bottom traces as one would see the bottom traces if the substrate 360 were transparent and the top traces were removed.)

In another embodiment, the bottom traces are not directly under the traces. This changes the parasitic characteristics of the integrated transformer (e.g., as described below, Cp1 570 and Ll1 520 for the primary winding 410, and Cp2 575 and Ll2 525 for the secondary winding 420).

Importantly, in one embodiment, the traces are made of the same material as is used in the rest of the network adapter card 310. For example, the top trace 412, the top trace 422, the bottom trace 414, and the bottom trace 424 are made of copper and are formed on the surface of the substrate 360. The traces are made during the manufacturing of the network adapter card 310 and at the same time that traces are made for the other adapter electronics 330. In one embodiment, the top and bottom traces are 0.007 ±0.001 inch wide, having a minimum spacing of 0.008 inches.

Two holes are made in the substrate 360. Each hole is made at approximately the center of a winding. For example, hole 415 is made in the center of the primary winding 410, while hole 425 is made in the center of the secondary winding 420. In the example of FIG. 4, each hole is approximately square. However, in one embodiment, the holes are approximately round because round holes are less costly to manufacture.

A ferrite core 450 is placed in the holes to form a closed loop. In one embodiment, the ferrite core 450 is made of two pieces of ferrite. The top is a U-shaped ferrite core piece 452. The bottom is an I-shaped ferrite core piece 454. The ends of the U-shaped piece 452 are placed through the holes. The I-shaped piece 454 is then attached to the ends of the U-shaped piece 452 that are protruding through the bottom of the substrate 360. In one embodiment, the I-shaped piece 454 is attached to the U-shaped piece using a clamp. The clamped U-shaped piece 452 and the I-shaped piece 454 form a closed ferrite loop through the primary winding 410 and the secondary winding 420. The closed loop allows the magnetic flux generated from the primary winding 410 to flow through the ferrite core 450. As the magnetic flux passes through the secondary winding 420, a current is induced in the secondary winding 420. Thus, a transformer is formed.

In one embodiment, the ferrite core 450 is made of two U-shaped core pieces from Fair-Rite Products Corporation of Wallkill, N.Y., part number 90—002002, made of material 77 (manganese-zinc material).

In this embodiment, the distance between the inner edges of the two holes is slightly less (e.g., 0.005 inches) than 0.09 inches and the distance between the outer edges of the two holes is slightly greater (e.g., 0.005 inches) than 0.34 inches. The traces are 0.007 inches wide. The spacing between two adjacent portions of trace material is 0.008 inches. The distance from the edge of a hole to the nearest edge of a trace is approximately 0.01 inches. Other embodiments of the invention use different sizes and distances depending upon the desired frequency response of the integrated transformer.

Thus, FIG. 4 and the above description, show how an integrated transformer can be built from a few traces, a substrate 360 and a ferrite core 450. This integrated transformer is much less expensive than previous isolation and filter circuits, such as the isolation and filter circuit 100. The reduced costs are a result of having fewer, lower cost, and more reliable components. For example:

the additional capacitors and inductors of the circuit 100 are not needed to provide the desired signal filtering.

the transformer 120 costs significantly more to build than the integrated transformer because the transformer 120 uses relatively expensive wire windings.

the integrated transformer is more reliable than the circuit 100 because the integrated transformer requires few, or no, external capacitors and inductors.

the integrated transformer is built using more reliable technology (e.g., the traces may have better tolerances than the tolerances of the transformer's 120 windings).

because the tolerances for fabricating the substrate 360 tend to be better than for the transformer 120, the integrated transformer has more consistent performance.

Integrated Transformer Model

Figure 5A:
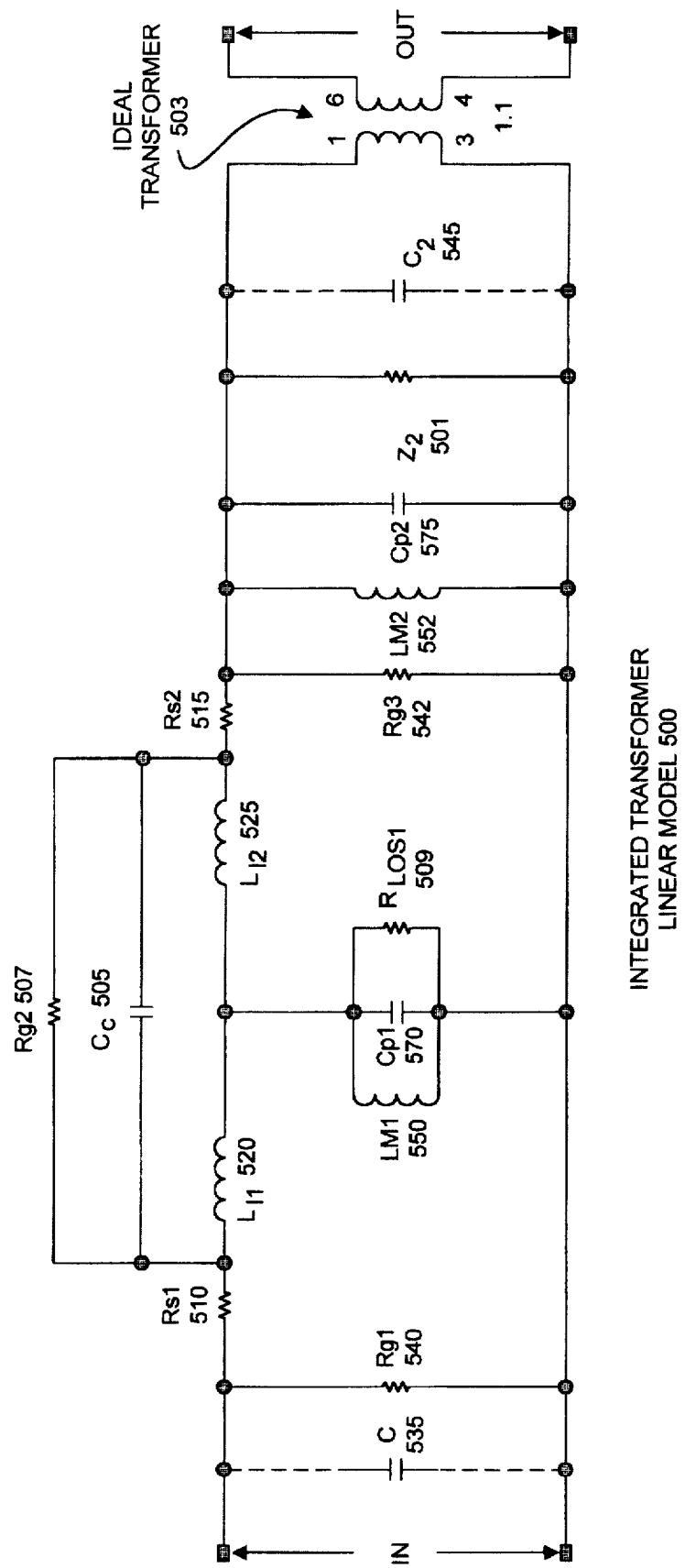
FIG. 5a and FIG. 5b illustrates a linear model of the layout of FIG. 4.
Figure 5B:
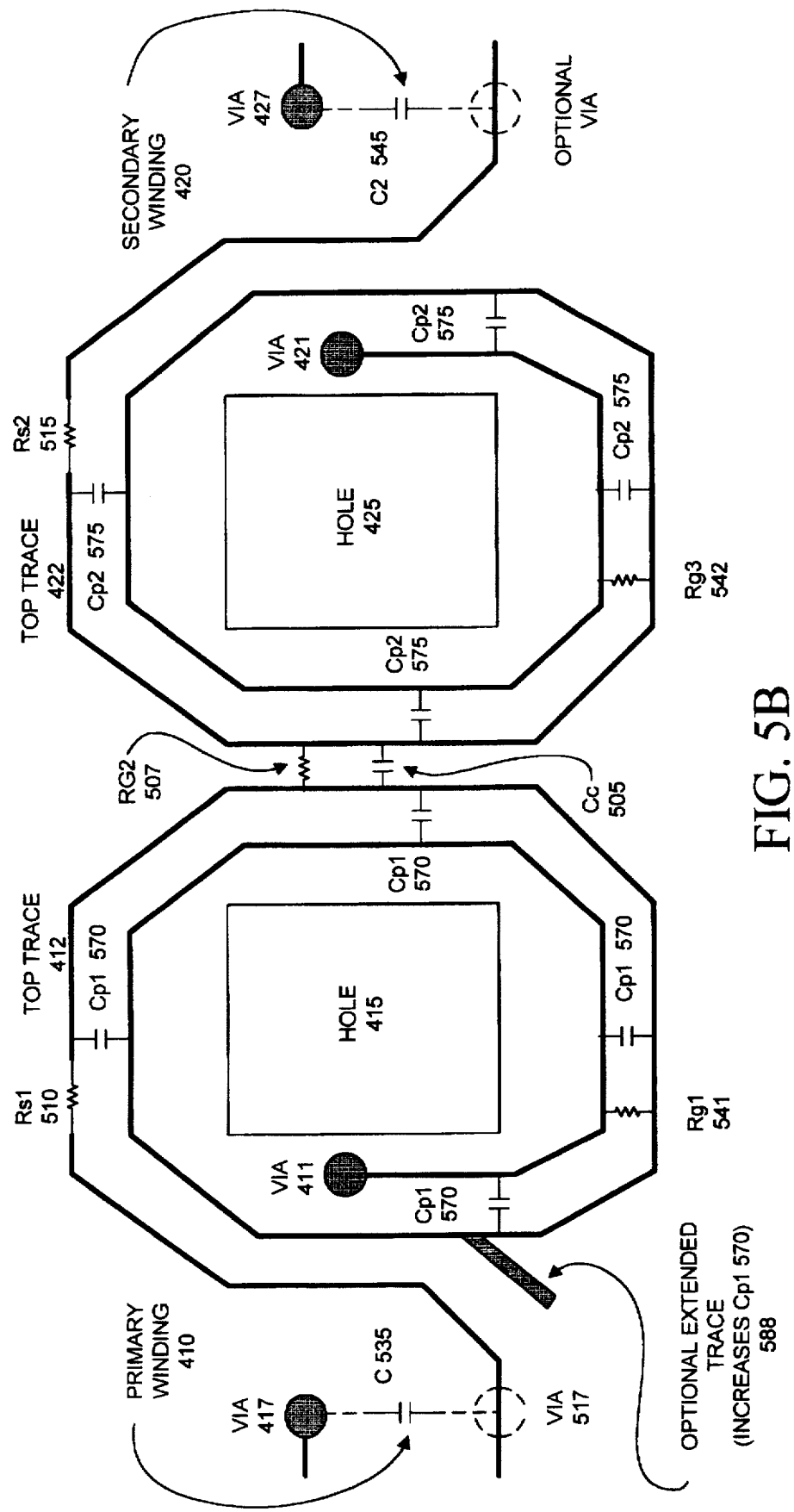

FIG. 5a and FIG. 5b illustrate an integrated transformer linear model 500. The integrated transformer linear model 500 shows how parasitic characteristics are used to change the filtering characteristics of an integrated transformer.

Table 1 shows the devices of the integrated transformer linear model 500.

TABLE 1

| Label | Description |
|---|---|
| Rs1 510 | Series resistance of the entire primary winding 410 (top trace 412 resistance plus bottom trace 414 resistance). |
| Ll1 520 | Leakage inductance of the primary winding 410. |
| Lm1 550 | Magnetizing inductance of the primary winding 410. |
| Cp1 570 | Inter-trace capacitance of the primary winding 410 (as shown in FIG. 5b and also between the top trace 412 and the bottom trace 414). |
| Rs2 515 | Series resistance of the entire secondary winding 420 (top trace 422 resistance plus bottom trace 424 resistance). |
| Ll2 525 | Leakage inductance of the secondary winding 420. |
| Cp2 575 | Inter-trace capacitance of the secondary winding 420 (as shown in FIG. 5b and also as between the top trace 422 and the bottom trace 424). |
| Zl 501 | Impedance of the load connected to the output of the secondary winding 420. |
| Ideal Transformer 503 | An ideal transformer with a transformer ratio of 1:1. (Although other ratios are used in other embodiments where the output voltage needs to be stepped up or stepped down.) |
| Cc 505 | Capacitive coupling between the primary winding 410 and the secondary winding 420. |
| Rg1 541 | Resistance between the primary winding 410 input terminals. The resistance is due to the conductivity of the dielectric material used as the substrate 360. |
| Rg2 507 | Resistance of dielectric material between the primary winding 410 and the secondary winding 420. |
| Rg3 542 | Resistance between the secondary winding 420 output terminals. The resistance is due to the conductivity of the dielectric material used as the substrate 360. |
| Rloss 509 | Resistance of the ferrite core 450. This is due to a heating of the core when transferring a signal from the primary winding 410 to the secondary winding 420. |

The following describes how the devices, of the integrated transformer linear model 500, are connected. Rg1 541 connects across the input terminals of the integrated transformer. Rs1 510 connects in serial to a first input terminal. Ll1 520 connects to the other terminal of Rs1 510. Ll2 525 connects to the other terminal of Ll1 520. Rs2 515 connects to the other terminal of Ll2 525. Rg3 542, Lm2 552, Cp2 575, Zl 501 and the primary winding of the ideal transformer 503 connect in parallel between the other terminal of Rs2 515 and the second input terminal. Lm1 550, Cp1 570 and Rloss 509 connect in parallel from the second input terminal and the connection between Ll1 520 and Ll2 525. Cc 505 and Rg2 507 connect in parallel to the connection between Rs1 510 and Ll1 520 and the connection between Ll2 525 and Rs2 515. The secondary winding of the ideal transformer 503 connects to the output terminals.

In previous systems, where the transformer is used only for isolation, such as in the isolation and filter circuit 100, the leakage inductance is kept to a minimum. That is, prior art transformers are manufactured to reduce the leakage inductance. The reason for this is that the leakage inductor acts to prevent the transformer from transferring all of the input signal to the output. However, in one embodiment of the invention, this feature of the leakage inductance, in conjunction with the primary winding's inter-trace capacitance, are advantageously used to filter the received signal. In this embodiment, the leakage inductance, Ll1 520, and the inter-trace capacitance, Cp1 570, are a series resonant circuit that act as a low pass filter. To change the resonance frequency, the leakage inductance, Ll1 520, is varied by varying the distance between the internal edges of the core and the number of turns (greater distance means a greater leakage inductance). The inter-trace capacitance, Cp1 570, is varied by varying the widths of the primary winding's traces and the distances between these traces.

Additionally, the magnetizing inductance, Lm1 550, and the inter-trace capacitance, Cp1 570, form a parallel resonant circuit that acts as a band pass filter. By varying Lm1 550 and Cp1 570, the resonance frequency for this filter can be changed. Lm1 550 can be varied by changing the materials used to make the ferrite core 450, the shape of the core (e.g., circular, rectangular), the layout of the trace, and the number of turns of the trace.

In other embodiments of the invention, Cp1 570 is changed in the following ways. In one embodiment, the substrate 360 includes additional layers, such as a ground plane, that can be used to alter Cp1 570. In another embodiment, Cp1 570 is changed by extending trace material from the top trace 412 and/or the bottom trace 414. An example of an extended trace is shown in FIG. 5b as extended trace 588. In another embodiment, similar extensions are made on both the primary winding 410 and the secondary winding 420 to vary Cc 505 and Rg2 507.

In one embodiment of the invention, the resonant frequency of both of these resonant circuits is altered so that the integrated transformer passes desirable frequencies and attenuates the other frequencies. Table 2 shows how some of the manufacturing variables can be changed to alter the values of the integrated transformer.

TABLE 2

| Label | Dependencies |
|---|---|
| Rs1 510 | Directly proportional to the length of the primary winding 410. Each additional length of the trace material adds to the resistance of the primary winding. Inversely proportional to the width and depth of the primary winding 410. Also depends on the resistance of the trace material used. |
| Ll1 520 | Depends upon the distance between the internal edges of the core, the physical layout of the trace, and the number of turns. |
| Lm1 550 | Directly proportional to the number of turns in the primary winding 410. Depends upon the properties of the ferrite core 450, such as its shape and composition (i.e. composition of metal). Also depends upon the frequency of input signal, the layout of the trace, and the number of turns. |
| Lm2 552 | Directly proportional to the number of turns in the secondary winding 420. Depends upon the properties of the ferrite core 450, such as its shape and composition (i.e. composition of metal). Also depends upon the frequency of input signal, the layout of the trace, and the number of turns. |
| Cp1 570 | Inversely proportional to the distance between the traces of the primary winding 410. This includes the distance between two adjacent lengths of the top trace 412 and the distance between the top trace 412 and the bottom |

TABLE 2-continued

| Label | Dependencies |
|---|---|
| | trace 414. In one embodiment, the top trace is displaced from the bottom trace 414 to alter Cp1 570. Also depends upon the trace material used and the dielectric characteristics of the substrate 360 material. |
| Rs2 515 | Similar to Rs1 510 except for the secondary winding 420. |
| Ll2 525 | Similar to Ll1 520 except for the secondary winding 420. |
| Cp2 575 | Similar to Cp1 570 except for the secondary winding 420. |
| Cc 505 | Inversely proportional to the distance between the edges of the primary winding 410 and the secondary winding 420. Depends on the trace material used and the dielectric characteristics of the substrate 360 material. Depends also on the relative trace positioning of the primary winding 410 and the secondary winding 420. The windings are shown adjacent to each other in FIG. 4, however, in one embodiment, a bifilar transformer is formed by forming the traces of the two windings next to each other. |
| Rg1 541 | Directly proportional to the distance between the edges of the primary winding 410 traces. Also depends upon the resistance of the dielectric material used as part of the substrate 360. |
| Rg2 507 | Directly proportional to the distance between the edges of the primary winding 410 and secondary winding 420. Also depends upon the resistance of the dielectric material. |
| Rg3 542 | Directly proportional to the distance between the edges of the secondary winding 420 traces. Also depends upon the resistance of the dielectric material used as part of the substrate 360. |
| Rloss 509 | Depends upon the core material being used as well as the input signal excitation (e.g., frequency and voltage). |

In one embodiment of the invention, the following manufacturing characteristics are modified: trace width, trace spacing, trace length, winding shape (only in the same approximate planes as the surfaces of the substrate 360), core shape, and core material. Importantly, the characteristics of the trace material and the substrate 360 material are not altered in this embodiment so that the integrated transformer is made using the same trace material and substrate 360 material as is used by, for example, the other adapter electronics 330. That is, in this embodiment, there is a common set of design rules, for making a printed circuit board, that are used by the integrated transformers and the other adapter electronics 330. These design rule specify which parameters may not be changed (e.g., the substrate 360 material, trace thickness) and which parameters may be changed (e.g., trace width).

In other embodiments, reactive elements, such as external capacitors and inductors, are added to the integrated transformer to help achieve a particular frequency response. For example, in one embodiment, an external capacitor, C 535, is included. C 535 is connected across the input terminals to the integrated transformer. For example, in one embodiment, C 535 is mounted through the via 417 and a new via 517. In another embodiment, a surface mounted capacitor is used.

C 535 effectively increases Cp1 570. C 535 is helpful where Cp1 570 cannot be increased to a desired level without undesirably altering other parameters of the model 500. In one embodiment, C 535 is determined so that the band pass filter of Cp1 570, C 535 and Lm1 550 has a frequency response that resonates at 10 MHz. In other embodiments, C 535 values are chosen for other frequencies (e.g., 200 kHz, 4 MHz, 16 MHz, 20 MHz, 100 MHz).

In one embodiment, C 535 is determined so that the integrated transformer, as laid out in FIG. 4, has a resonant frequency of 10 MHz. C 535 is determined as follows.

First, the inductance, L, of the integrated transformer, as measured across the input terminals of the primary winding 410, is determined. L is proportional to Ll1 520 and Lm1

Figure 7A:
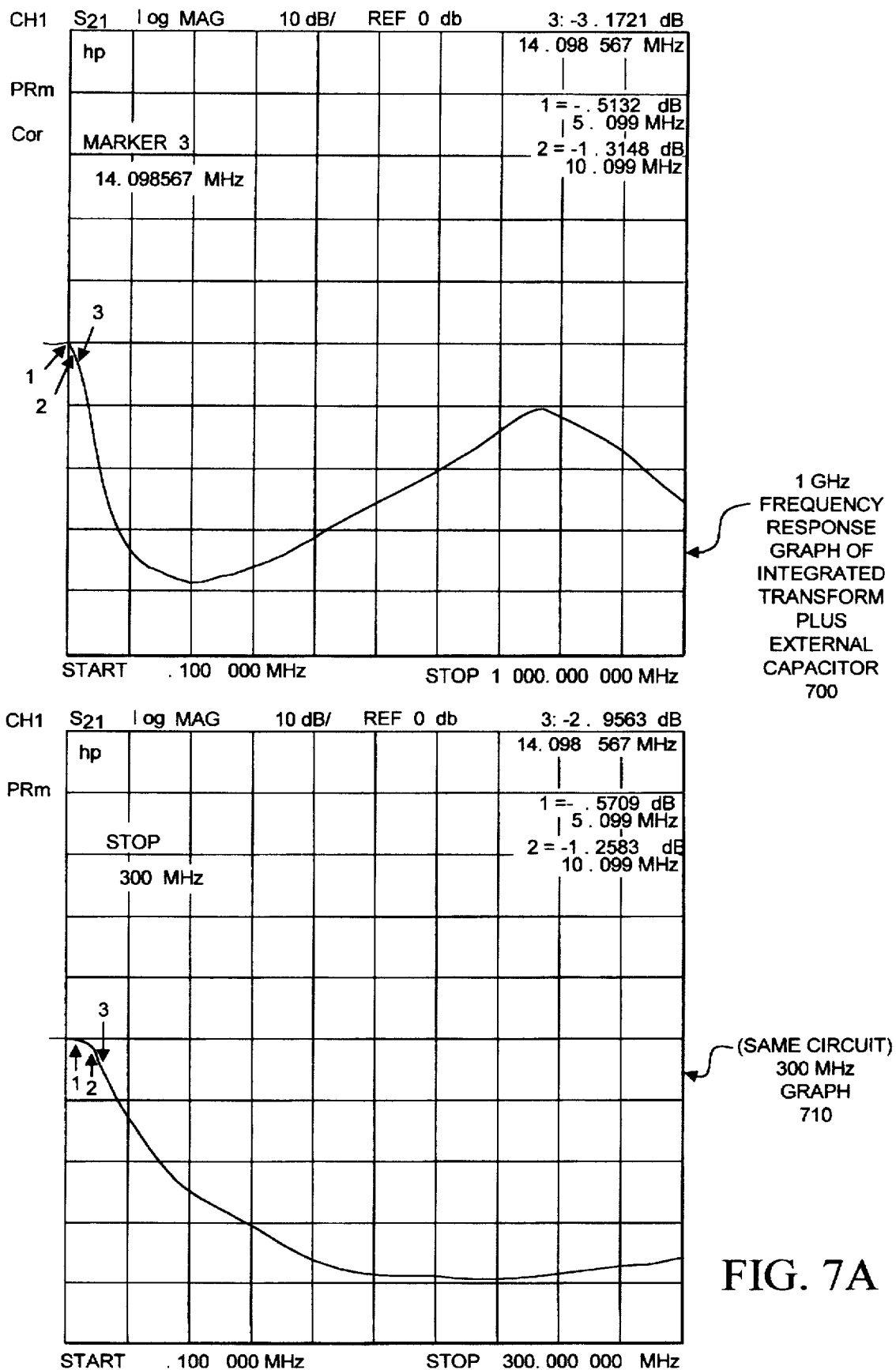
FIG. 7a and FIG. 7b illustrate an example frequency response of one embodiment of the invention including an external capacitor.
Figure 7B:
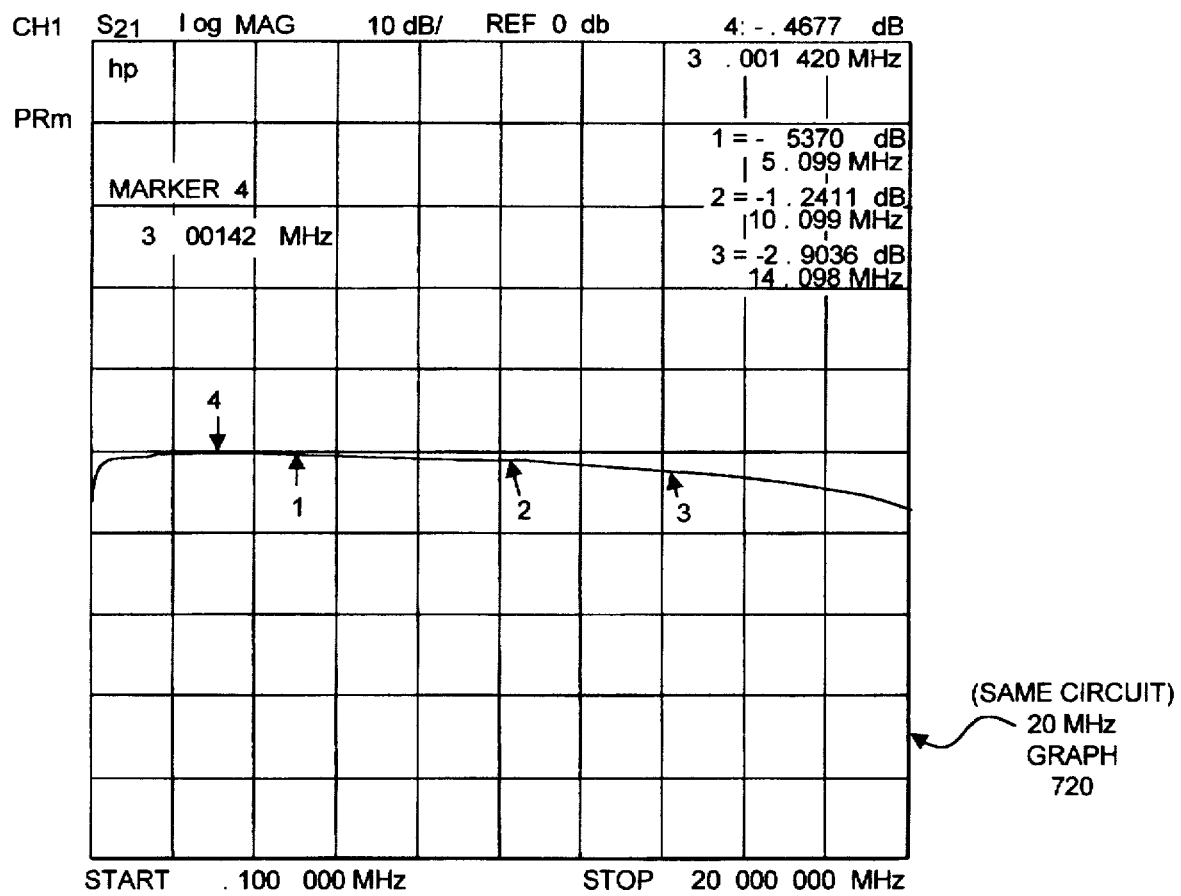

550. In one embodiment, L is measured, for a given integrated transformer, from a Smith chart plot, at the 10 MHz point, generated by a 1 GHz Hewlett-Packard Network Analyzer. In the example of FIG. 4, L is approximately 643 nH. C is then determined as follows:

$\Omega^2 = 1/LC$ $C = 1/L\Omega^2$ $C = 1/(643 \text{ nH})(2*3.14*10\text{MHz})^2$ Thus, C 535 is approximately 395 pF. Thus, this integrated transformer will have a resonant frequency at 10 MHz. (This is shown in FIG. 7a and 7b and described below.)

Integrated Transformer Frequency Response

Figure 6:
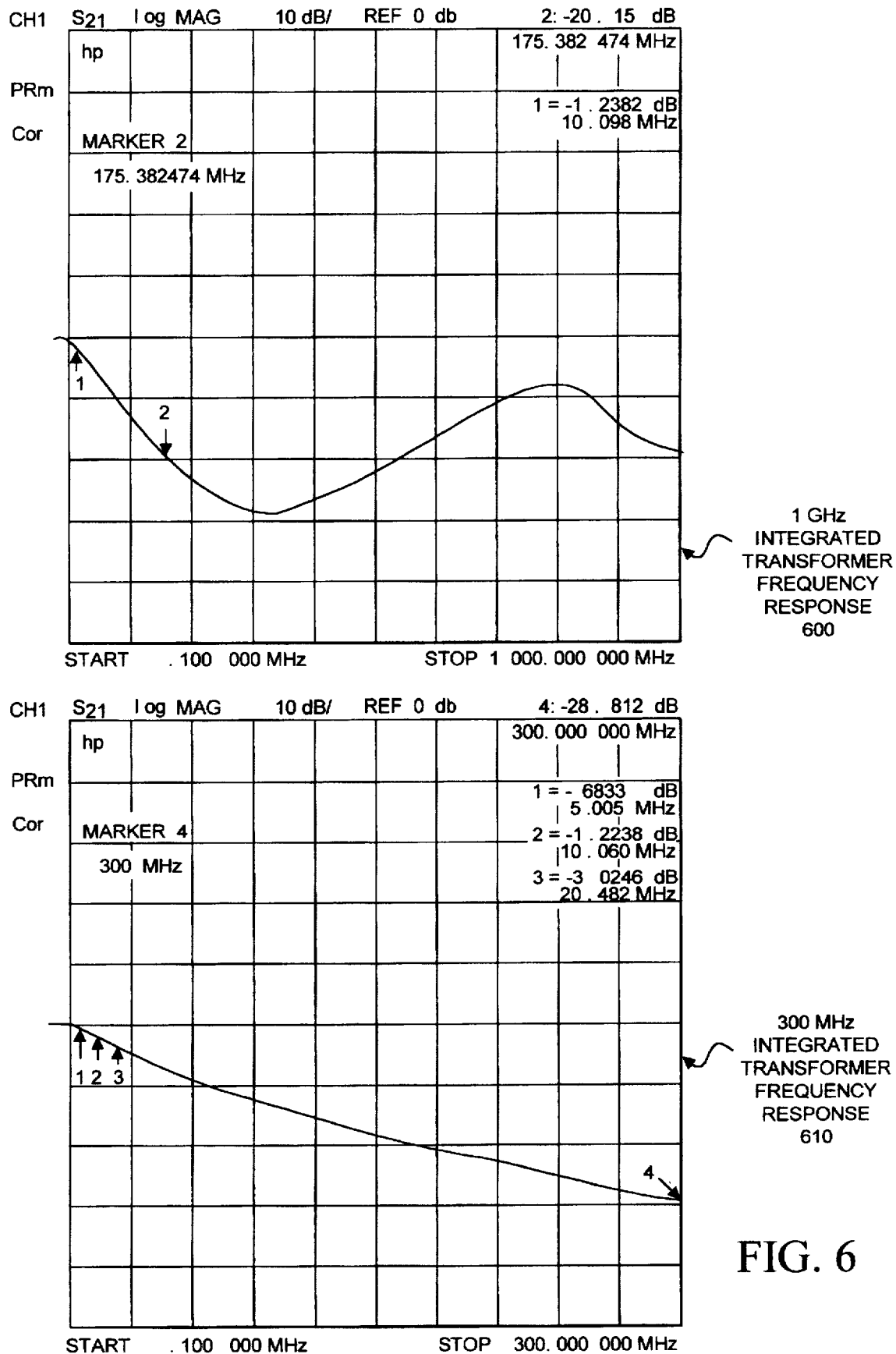
FIG. 6 illustrates an example frequency response of one embodiment of the invention.

FIG. 6 illustrates the frequency response of an integrated transformer using the layout of FIG. 4. As can be seen in the 1 GHz integrated transformer frequency response graph 600, at approximately 10 MHz, the signal has been reduced by 1.2 dB. The signal response then begins to roll off, reaching almost −30 dB by approximately 300 MHz. Although not ideal for some communications applications, the graph 600 illustrates that the parasitic characteristics of the integrated transformer can be used to make the integrated transformer into a filter. By altering the parasitic characteristics greater roll off can be achieved and at the desired frequency.

A different Cc 505 changes frequency response. In one embodiment, Cc 505 is reduced to help attenuate undesirable high frequency signals. In one embodiment, Cc 505 is reduced by placing a trace connect to ground between the primary winding 410 and the secondary winding 420. In this embodiment, the additional trace to ground also helps increase Cp1 570 and Cp2 575. In another embodiment, Cc 505 is reduced by increasing the distance between the closest trace edge of the primary winding 410 to the closest trace edge of the secondary winding 420. One method of increasing Cc 505 is to position the primary winding 410 and the secondary winding 420 next to each other to create a bifilar integrated transformer. Cc 505 acts as a parallel resonant circuit with Ll1 520+Ll2 525, thereby reducing the energy transfer from the input terminals to the output terminals at a certain frequency.

Integrated Transformer with External Capacitor Frequency Response

FIG. 7a and 7b illustrate the frequency response of an integrated transformer using the layout of FIG. 4 and including an external capacitor C 535 of approximately 380 pF. As can be seen in the 1 GHz integrated transformer frequency response graph 700, at approximately 10 MHz, the signal has been reduced by only 1.3 dB. The signal now begins to roll off much more quickly than the integrated transformer without the capacitor, reaching −20 dB by 40 MHz. Also, advantageously, the high frequency response, at approximately 800 MHz, is also reduced.

FIG. 7b illustrates that only a small amount of the signal is lost in the 100 kHz to 10 MHz frequency range. For 10 Mbit ethernet communications, low signal loss in this frequency range is desirable. However, in one embodiment of the invention, additional changes in the parasitic characteristics of the integrated transformer cause the band stop filter characteristics of Ll1 and Cp1 to have greater effect. This reduces some of the low frequency components of the signal. For some communications protocols, the loss of these frequency components are relatively insignificant.

Figure 8A:
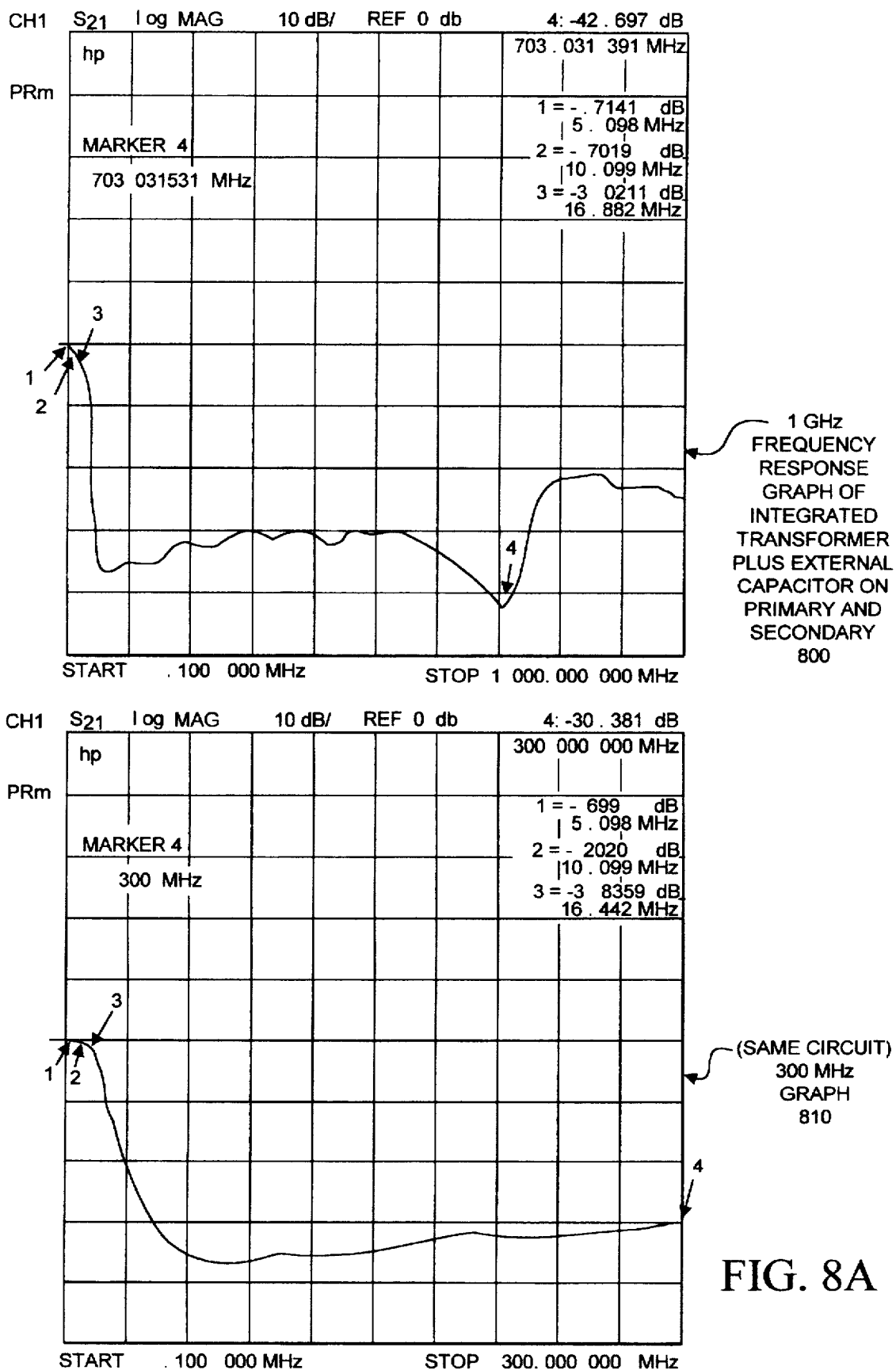
FIG. 8a and FIG. 8b illustrate an example frequency response of one embodiment of the invention including two external capacitors.
Figure 8B:
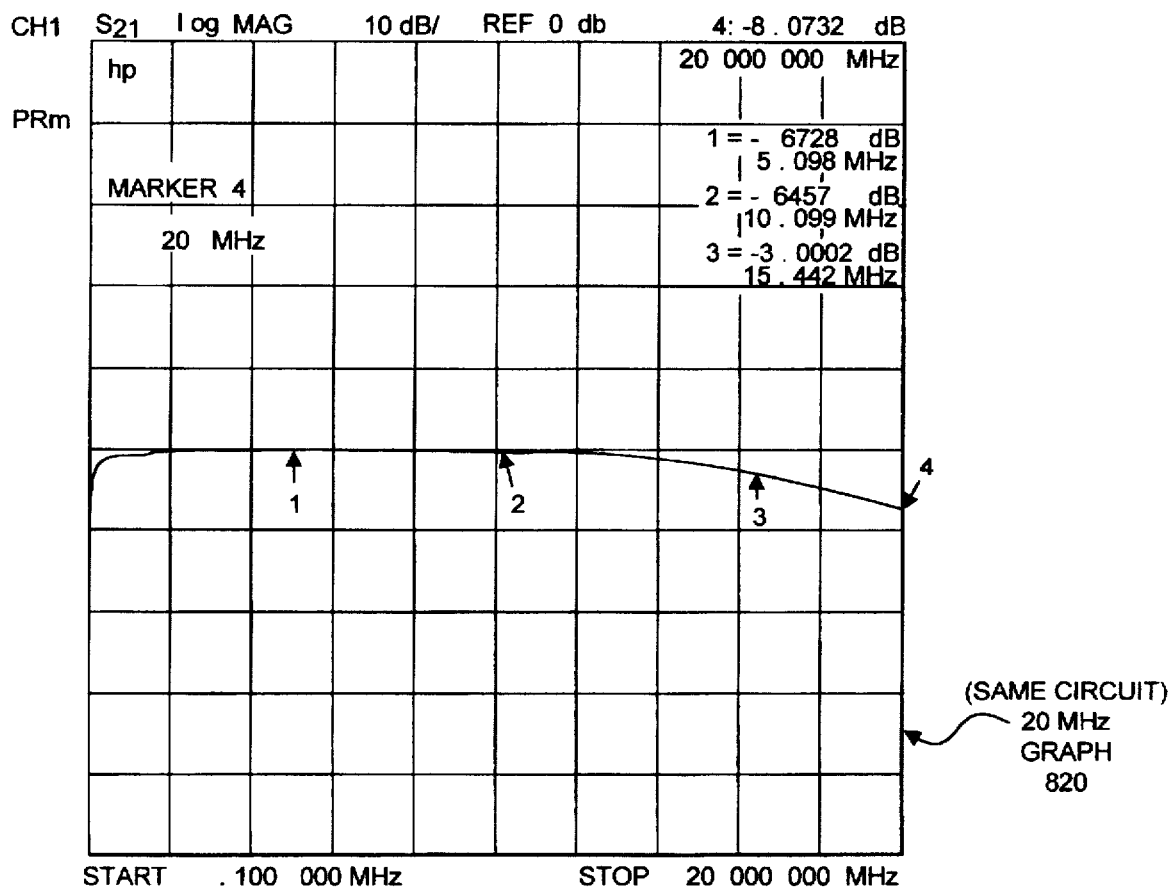

FIG. 8a and FIG. 8b illustrate the frequency response of the same embodiment of the integrated transformer as in FIG. 7a and 7b, but with the addition of a second external capacitor C2 545. C2 545 is connected across the output terminals of the integrated transformer to be tuned to the desired frequency response. In one embodiment, the capacitance of C2 545 is determined in a similar manner as C 535. In the example of FIG. 8a and FIG. 8b, C2 545 has a capacitance of approximately 380 pF.

The addition of C2 545, at the secondary winding 420 output terminals, creates a series resonant circuit with Ll2 525 at approximately 700 MHz. Thus, high frequency signals are attenuated. FIG. 8a shows that all of the high frequency signals are attenuated below 20 dB.

Also note that this embodiment also has significantly better roll off than either the circuits of FIG. 6 or FIG. 7a. FIG. 8b shows that the important frequency response between five MHz and ten MHz is relatively linear. Additionally, the amount of signal loss has improved to only approximately 0.6 dB at approximately 10 MHz. In particular, compared with the prior art frequency response in graph 220, the frequency response of the embodiment of FIG. 8a and FIG. 8b has less signal loss between five MHz and 10 MHz.

Figure 9:
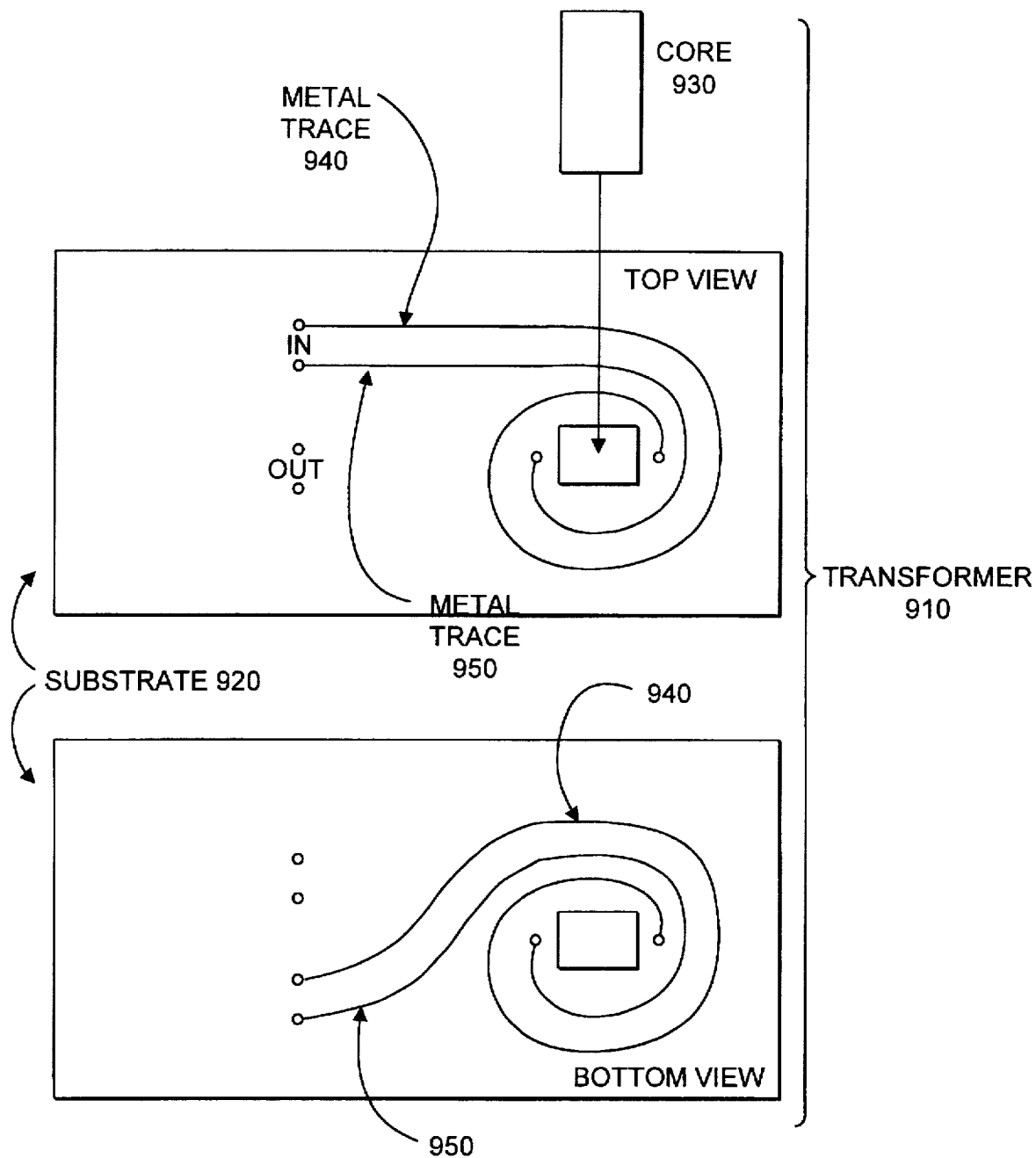
FIG. 9 illustrates a bifilar transformer.

FIG. 9 illustrates a bifilar transformer as can be used in one embodiment of the invention. In this embodiment, the transformer 910 includes a substrate 920, a core 930, a metal trace 940, and a metal trace 950. The metal trace 940 and the metal trace 950 are formed in a spiral around the core 930. This shape increases the coupling capacitance between the two metal traces.

Figure 10:
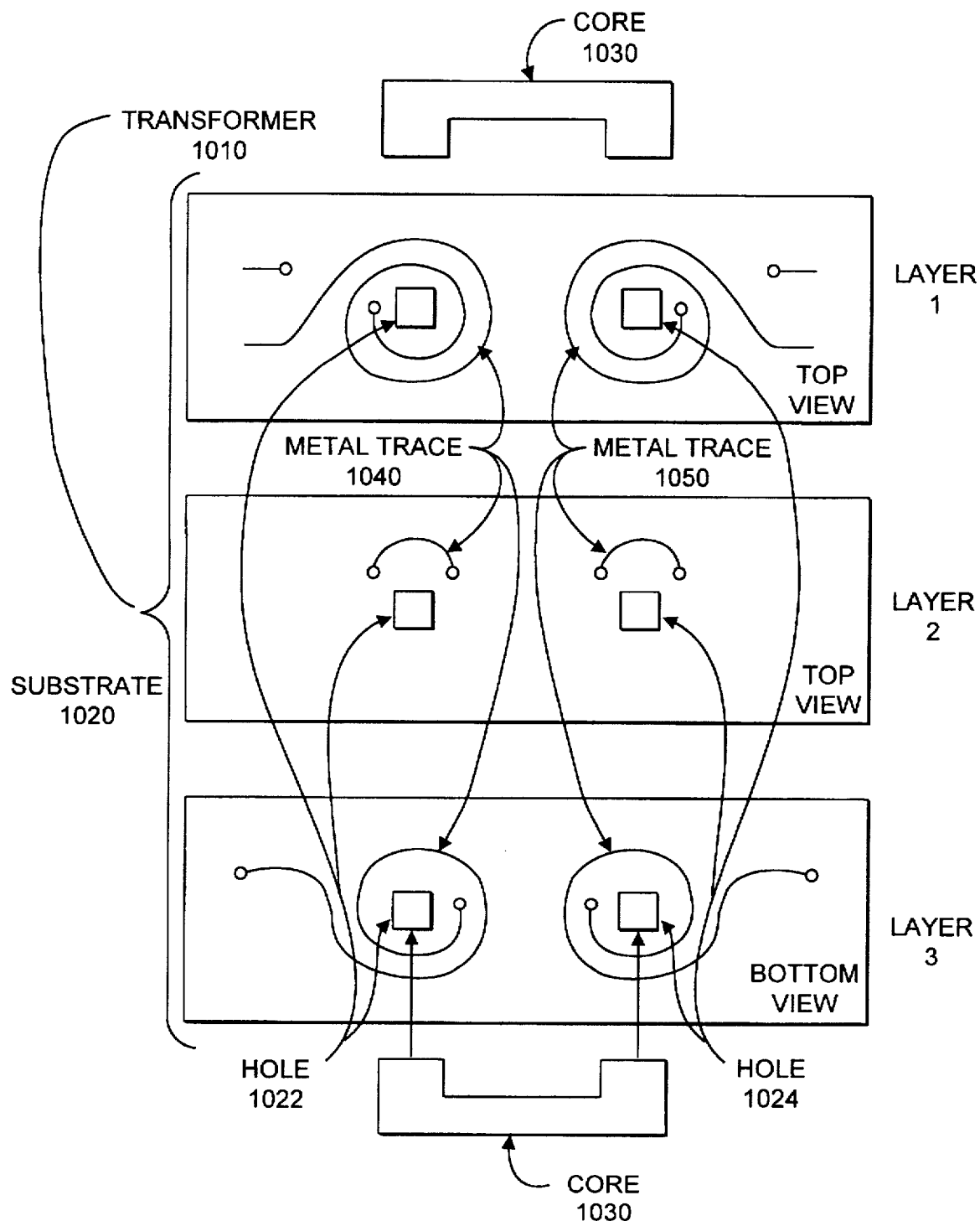
FIG. 10 illustrates a multi-layered substrate having an integrated transformer.

FIG. 10 illustrates one embodiment of the invention having a transformer 1010 for electrically isolating and filtering a network communications signal. The transformer 1010 comprises a substrate 1020, a closed loop of ferrite core 1030, a metal trace 1040, and a metal trace 1050. The substrate has a hole 1022 and a hole 1024 through the substrate. The closed loop of ferrite core 1030 is disposed through the hole 1022 and the hole 1024. The metal trace 1040 is positioned in a spiral around the hole 1022. The metal trace 1040 is coupled to receive network communications signals. The metal trace 1050 is positioned in a spiral around the hole 1024 and is coupled to filter and transmit network communications signals.

In this embodiment, the substrate has three layers. The metal trace 1040 couples the part of the trace on the top layer to the part of the trace on the middle layer. The part of the trace on the middle layer is coupled to the part of the trace on the bottom layer.

The metal trace 1040 is positioned to at least increase the coupling capacitance to cause the transformer to attenuate signals above 300 MHz by more than three dB while not attenuating signals at, or near 100 MHz, by more than three dB.

The above describes many different integrated transformers tuned to provide specific desired frequency responses. Importantly, the integrated transformers greatly reduce the cost of manufacturing filtering and isolation circuits in network adapter cards, and other communications systems, by integrating the filtering and isolation functions into one structure. The integrated transformer is made from traces on a substrate and a ferrite core. In one embodiment, the same techniques used for forming the traces to connect the rest of the components on the substrate are used to create the traces for the windings of the integrated transformer, thereby reducing the cost of the integrated transformer. The parasitic characteristics of the windings and the ferrite core are modified to advantageously change the frequency response of the integrated transformer. In one embodiment, external reactive elements, such as an external capacitor, are added to further change the frequency response of the integrated transformer.

What is claimed is:

1. A network adapter card comprising:

a substrate having two pairs of holes through said substrate, said substrate having a pattern of a plurality of conductive traces used to form circuits;

a network communications circuit, having an input port and an output port, being at least partially formed by at least one trace of said plurality of conductive traces;

a receive transformer coupled to said input port;

a send transformer coupled to said output port;

wherein each of said receive transformer and said send transformer includes, a primary winding, formed from at least a first trace of said plurality of conductive traces, said first trace being formed around a first hole of one pair of holes;

a secondary winding, formed from at least a second trace of said plurality of conductive traces, said second trace being formed around a second hole of said one pair of holes;

a core formed in a loop and disposed through one pair of holes of said two pairs of holes, said receive transformer being disposed through a different pair of holes than said send transformer, wherein said primary winding and said secondary winding are formed around a first pair of holes of said pair of holes and said primary winding and said secondary winding are formed around a second pair of holes of said pair of holes, and wherein said first trace and said second trace are positioned to increase a parasitic capacitance of each transformer to cause said send transformer to filter network communication signals received by said primary winding of said send transformer.

2. The network adapter card of claim 1 wherein said first trace and said second trace of said send transformer are formed to have a different parasitic capacitance than said first trace and said second trace of said receive transformer, said send transformer having a different frequency response than said receive transformer.

3. The network adapter card of claim 1 wherein said first trace of said send transformer couples to said output port and wherein said second trace of said receive transformer couples to said input port.

4. The network adapter card of claim 1 wherein each transformer has a frequency response having less than three dB attenuation at ten MHz and greater than three dB attenuation at greater than 20 MHz.

5. The network adapter card of claim 1 wherein each transformer has a frequency response having less than three dB attenuation at one hundred MHz and greater than three dB attenuation at greater than three hundred MHz.

6. The network adapter card of claim 1 further including a first capacitor coupled across said primary winding of said send transformer, said first capacitor to further filter signals received by said primary winding.

7. The network adapter card of claim 6 wherein said first capacitor is chosen so that said send transformer has a frequency response having less than three dB attenuation at ten MHz and greater than three dB attenuation at greater than approximately fourteen MHz.

8. The network adapter card of claim 6 further including a second capacitor coupled across said secondary winding of said send transformer, said second capacitor to further filter signals received by said primary winding.

9. The network adapter card of claim 1 wherein said first trace is formed partially on a top surface of said substrate and partially on a bottom surface said substrate.

10. A network adapter card comprising:

a circuit board having a first surface and a second surface, said first surface being parallel to said second surface, said circuit board having a pattern of metal traces to form circuits;

a communications circuit including at least a first integrated circuit mounted on said circuit board, said communications circuit having an input and an output;

a receive transformer, said receive transformer having a first primary winding, a first secondary winding and a first ferrite core, said first primary winding having a first pair of primary winding terminals coupled to receive a signal from a network, said first primary winding being formed from a first spiral metal trace at least on said first surface, said first secondary winding having a first pair of secondary winding terminals coupled to said output of said communications circuit, said first secondary winding being formed from a second spiral metal trace at least on said first surface, said first ferrite core being formed in a closed loop through said circuit board and through approximately the centers of said first spiral metal trace and said second spiral metal trace; and a send transformer, said send transformer having a second primary winding, a second secondary winding and a second ferrite core, said second primary winding having a second pair of primary winding terminals coupled to said input of said communications circuit, said second primary winding being formed from a third spiral metal trace at least on said first surface, said second secondary winding having a second pair of secondary winding terminals coupled to transmit a signal from said network adapter card, said second secondary winding being formed from a fourth spiral metal trace at least on said first surface, said second ferrite core being formed in a closed loop through said circuit board and through approximately the centers of said third spiral metal trace and said fourth spiral metal trace.

11. The network adapter card of claim 10 wherein said first spiral metal trace and said second spiral metal trace are formed partially on said second surface.

12. The network adapter card of claim 11 wherein said first spiral metal trace is formed from a first partial metal trace and a second partial metal trace, said first partial metal trace being formed on said first surface, said second partial metal trace being formed on said second surface, and wherein said first partial metal trace is partially offset from said second partial metal trace in a plane parallel with said first surface and said second surface.

13. The network adapter card of claim 10 wherein said circuit board includes glass epoxy, laminated NEMA GRADE FR-4 material.

14. The network adapter card of claim 10 wherein said first spiral metal trace, said second spiral metal trace, said third spiral metal trace, are all made of copper, and wherein said first pair of secondary winding terminals are coupled to said input of said communications circuit by a first copper trace, and where said second pair of primary winding terminals are coupled to said output of said communications circuit by a second copper trace.

15. The network adapter card of claim 10 wherein said communications circuit includes a circuit for preparing and transmitting ten Mbit ethernet signals.

16. A transformer for electrically isolating and filtering a network communications signals, said transformer comprising:

- a substrate having a plurality of metal traces positioned in said substrate, said plurality of metal traces being part of a first layer of said substrate, said substrate having a first hole and a second hole;
- a closed loop of ferrite core disposed through said first hole and said second hole;
- a first metal trace, of said plurality of metal traces, positioned in a spiral around said first hole, at least a first end of said first metal trace coupled to receive said network communications signals;
- a second metal trace, of said plurality of metal traces, positioned in a spiral around said second hole, at least a first end of said second metal trace coupled to transmit filtered network communications signals generated from said network communications signals; and
- wherein said first metal trace is positioned to at least increase the coupling capacitance of said first metal trace to cause said transformer to have a frequency response where said filtered network communication signals are not attenuated by more than three dB at frequencies near one hundred MHz and are attenuated by more than three dB at frequencies greater than three hundred MHz.

17. The transformer of claim 16 wherein said substrate has a top surface and a bottom surface, and said first metal trace is positioned in said first layer, a second layer, and a third layer of said substrate, said first layer being on said top surface, said second layer being on said bottom surface, and said third layer being positioned between said first layer and said second layer in said substrate, said first metal trace further comprising a first portion, a second portion and a third portion, said first portion being positioned in said first layer, said second portion being positioned in said second layer, and said third portion being positioned in said third layer, and wherein a first end of said first portion is coupled to a first end of said third portion, a second end of said third portion is coupled to a first end of said second portion, and where a second end of said first portion and a second end of said second portion act as a pair of input terminals to said transformer.

* * * * *